United States Patent [19]
Hagino et al.

[11] 3,933,541
[45] Jan. 20, 1976

[54] PROCESS OF PRODUCING SEMICONDUCTOR PLANAR DEVICE

[75] Inventors: Hiroyasu Hagino; Yasuya Kajiwara; Seiichi Nagai, all of Itami, Japan

[73] Assignee: Mitsubishi Denki Kabushiki Kaisha, Japan

[22] Filed: Jan. 20, 1975

[21] Appl. No.: 542,251

[30] Foreign Application Priority Data
Jan. 22, 1974  Japan.................................. 49-9868
Feb. 16, 1974  Japan................................ 49-18936

[52] U.S. Cl.................................. 148/187; 29/576
[51] Int. Cl.²...................................... H01L 21/322
[58] Field of Search..................... 148/187; 29/576

[56] References Cited
UNITED STATES PATENTS

| | | | |
|---|---|---|---|
| 3,281,915 | 11/1966 | Schramm........................ | 148/187 X |
| 3,477,886 | 11/1969 | Ehlenberger....................... | 148/187 |
| 3,597,667 | 8/1971 | Horn................................ | 148/187 X |
| 3,696,276 | 10/1972 | Boland........................ | 148/187 UX |
| 3,717,514 | 2/1973 | Burgess............................ | 148/187 X |

*Primary Examiner*—L. Dewayne Rutledge
*Assistant Examiner*—J. M. Davis
*Attorney, Agent, or Firm*—Robert E. Burns; Emmanuel J. Lobato; Bruce L. Adams

[57] ABSTRACT

A silicon dioxide film and a silicon nitride film are successively vapor-deposited on a main face of an N type silicon substrate processed with $H_2O_2$ water. Those portions of both films underlaid by a P type region to be subsequently formed and their peripheral portions are selectively removed. Then a P type impurity is diffused into the central exposed portion of the main substrate face to form the P type region with a PN junction having a termination facing the silicon dioxide film. Also a silicon dioxide film is thermally formed on the peripheral exposed portion of the main face.

8 Claims, 10 Drawing Figures

PROCESS OF PRODUCING SEMICONDUCTOR PLANAR DEVICE

BACKGROUND OF THE INVENTION

This invention relates to improvements in processes of producing semiconductor planar devices such as semiconductor planar diodes, planar transistors, planar thyristors, planar bidirectional triode thyristors such as triac (trade mark).

Semiconductor planar devices include the PN junction inevitably intersecting the main face of the semiconductor substrate and therefore having its curved surface portion. An electric field involved tends to be concentrated in the curved surface portion of the junction so that the curved surface portion of the junction may be broken down with a lower applied voltage than that a breakdown voltage the flat portion thereof. In that event the smaller the radius of curvature of the curved surface portion of the PN junction the less the breakdown voltage will be. In order to produce high breakdown voltage semiconductor planar devices, it is required to effect the deep diffusion to increase the radius of curvature. In planar thyristor etc. this deep diffusion causes both the current gain and cut-off frequency to be decreased.

Also electrically insulating films for coating the PN junction have been previously formed of silicon dioxide ($SiO_2$) prepared either by thermally oxidizing the surface of silicon substrates or by chemically processing the surface of silicon substrates followed by the growth from gaseous phase. As well known, a positive surface charge is present at the interface between the substrate surface and the silicon dioxide film thus formed. This positive surface charge restrains a depletion layer for the PN junction from spreading in the vicinity of the substrates surface. Thus the presence of the positive surface charge in an excessive quantity causes the particular electric field to be concentrated in the vicinity of the surface of the substrate resulting in the occurrence of the breakdown with a low voltage.

Therefore it has been heretofore difficult to impart the high breakdown voltage characteristic to semiconductor planar devices.

SUMMARY OF THE INVENTION

Accordingly, it is an object of the present invention to provide a new and improved process of producing high breakdown voltage semiconductor planar devices with a high yield and with the number of the manufacturing steps reduced.

It is another object of the present invention to provide a new and improved process of readily producing high voltage planar type semiconductor diodes, transistors, thyristor, bi-directional triode thyristor, integrated circuits etc.

The present invention accomplishes these objects by the provision of a process of producing a semiconductor planar device comprising the steps of immersing a main face of an N type silicon substrate into aquaous hydrogen peroxide or a mixture of aquaous hydrogen peroxide and a chemical compound including an amino radical, successively depositing a silicon dioxide film and a silicon nitride film on the main face of the silicon substrate processed in the preceding step through the chemical vapor deposition, selectively removing those portions of the silicon dioxide film and the silicon nitride film underlaid by a predetermined area of the main face of the silicon substrate where a P type semiconductor region is subsequently formed, thereby to expose the predetermined area of the main face of the silicon substrate, and diffusing a P type impurity into the predetermined exposed area of the main face to form the P type semiconductor region in the N type silicon substrate with a PN junction formed therebetween to terminate at the main face of the silicon substrate.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
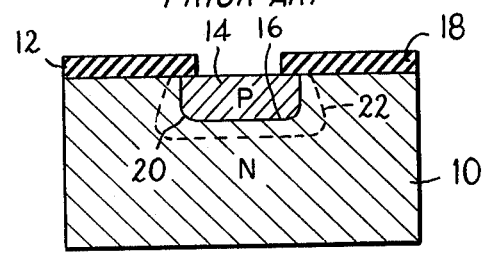
FIG. 1 is a schematic sectional view of a semiconductor planar diode constructed in accordance with the prior art.

Referring now to the drawings, FIG. 1, there illustrates a conventional semiconductor planar diode. The diode illustrated can be produced by first applying to a main face of an N type silicon diode 10 a film of electrically insulating material 12 such as silicon dioxide ($SiO_2$), and then selectively diffusing a P type impurity into the main face of the substrate to form a P type diffusion region 14 with the insulating film 12 used as a mask. The diode thus produced has a PN junction 16 formed between the N type substrate and P type diffusion region 10 and 14 respectively. Since the PN junction 16 includes its end or termination 18 necessarily intersecting the main face of the substrate 10, it has inevitably a curved surface portion 20. Therefore the reverse bias of the PN junction 16 causes an electric field involved to concentrate in the curved surface portion 20 of the PN junction 16 with the result that the PN junction 14 can be broken down on the curved surface portion with a low reverse voltage applied thereto as compared with the flat portion thereof. In that event the smaller the radius of curvature of the curved surface portion 20 the less that breakdown voltage will be.

In order to produce high breakdown voltage semiconductor elements, it is required to increase the radius of curvature of the curved surface portion of the PN junction by effecting the deep diffusion of the impurity. However this deep diffusion is not desirable for transistors and the like because the resulting current gain and cut-off frequency are reduced.

Also in order to produce high breakdown voltage thyristors, it is necessary to deepen the diffusion of the impurity for forming the cathode base region thereby to increase the radius of curvature of the curved surface portion of the forward blocking junction. This increase in depth of the cathode base region leads to the necessity of increasing the thickness of semiconductor wafers in view of the design of semiconductor elements. This results in the disadvantage that the diffusion for isolation consumes long time.

Further upon coating the junction with an electrically insulating film, a silicon dioxide ($SiO_2$) film has been heretofore utilized in many cases. The silicon dioxide film could be formed either by thermally oxidizing the surface of silicon substrates or by chemically processing the surface of substrates with hydrofluoric acid, nitric acid or the like followed by the growth from gaseous phase or chemical vapor deposition. It is well known that a positive surface charge is present at the interface between the surface of the substrate and the silicon oxide film as above described. This positive surface charge functions to restrain a depletion layer for the PN junction from spreading in the vicinity of the surface of the substrate. Thus the presence of the positive surface charge in an excessive quantity causes the particular electric field to be concentrated in the vicinity of the surface of the substrate resulting in the occurrence of the breakdown with a low voltage. FIG. 1 shows dotted line 22 designating a boundary to which the depletion layer is spreaded.

The present invention contemplates to produce high breakdown voltage semiconductor planar devices with a high yield and with the number of the manufacturing steps reduced.

Figure 2A:
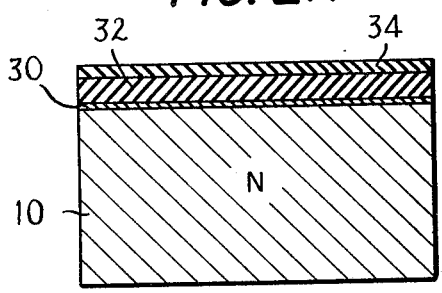
FIGS. 2A and 2B show schematic sectional views illustrating the different manufacturing steps of a process of producting a semiconductor planar diode in accordance with the principles of the present invention.
Figure 2B:
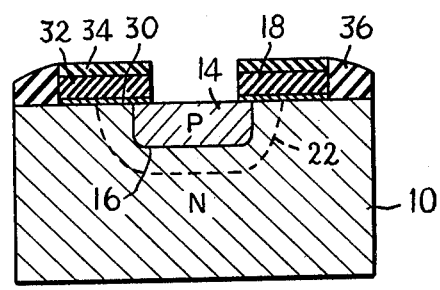

Referring now to FIGS. 2A and 2B, there is illustrated a process of producing a silicon planar diode in accordance with the principles of the present invention. As shown in FIG. 2A, an N type silicon substrate 10 has one main face 30 processed by immersing it into aquaous hydrogen peroxide ($H_2O_2$), after the main face has been immersed into dilute hydrofluoric acid, to be rendered hydrophobic. While this processing with aquaous hydrogen peroxide becomes effective by simultaneous heating it is more effective by adding to the aquaous hydrogen peroxide a chemical compound including an amino radical, for example, ammonia solution or by heating following this addition of the chemical compound. The main substrate face 30 processed with aquaous hydrogen peroxide has been hydrophilic.

Then what is deposited on the main face 30 thus processed is a double layer film consisting of a silicon dioxide ($SiO_2$) film 32 and a silicon nitride ($Si_3N_4$) film 34 by chemical vapor deposition technique well known in the art with the silicon dioxide film 32 directly contacted by the main face 30. In the arrangement of FIG. 2A a surface charge developed at the interface between the silicon substrate and silicon dioxide film 10 and 32 respectively can be made negative. It is to be noted, however, that the silicon dioxide film 32 should be deposited on the main substrate face 30 according to chemical vapor deposition technique. If thermal oxidation or sputtering technique is used to form the silicon dioxide film then it is difficult to develope a negative surface charge at the interface between the silicon substrate and silicon dioxide film thus formed. For example, the formation of the silicon dioxide film 32 may readily be accomplished by the reaction of monosilane ($SiH_4$) on oxygen ($O_2$) in an atmosphere of nitrogen.

In order to form a P type semiconductor region in the N type silicon substrate 10, those portions of the double layer film 32–34 underlaid by a predetermined area of the main substrate face 30 and another predetermined area in this case, the peripheral portion thereof are first selectively removed in the well known manner until the predetermined area and peripheral portion of the main surface 30 are exposed. The P type semiconductor region is adapted to be formed in the predetermined area of the main substrate face 30 in the next subsequent diffusion step. The peripheral portion of the main face 30 surrounds the predetermined area thereof through a predetermined spacing. Subsequently the exposed face portions of the silicon substrate are thermally oxidized whereby a silicon dioxide film 36 in the form of an annulus is thermally formed on the peripheral portion of the main face 30 while another silicon dioxide film (not shown) is also formed on the predetermined area of the main substrate face 30. The purpose of the annular silicon dioxide film 36 is to prevent a depletion layer for a PN junction formed in the silicon substrate 10 in the next succeeding diffusion step from spreading enough to reach the peripheral portion of the substrate.

In order to accomplish the same purpose, only the peripheral portion of the silicon nitride film 32 may be suitably removed from the double layer film 32–34 and then a silicon dioxide film is formed on the exposed peripheral portion of the silicon dioxide film 34 through the thermal oxidation. This results in a double layer silicon oxide film in the form of an annulus including the thermally formed silicon dioxide film overlaid by the vapor deposited silicon dioxide film.

Then after the silicon dioxide film on the predetermined area of the main face 30 has been removed, a P type conductivity imparting impurity is selectively diffused into the predetermined area of the main face 30 to form a P type region 14 with a PN junction 16 formed between the latter and the N type substrate 10 as shown in FIG. 2B. It is noted that the PN junction has its termination or end 18 located on that portion of the main surface 30 overlaid by the double layer film 32–34. As above described, a negative surface charge is developed at the interface between that double layer film 32 and the silicon substrate 10.

It will readily be understood that, if the diffusion step as above described proceeds in an oxidative atmosphere that the thermally oxidizing step of forming the silicon oxide film 36 may be omitted.

In the arrangement of FIG. 2B produced in the manner as above described, the termination 18 of the PN junction 16 and the adjacent portions of the N type silicon substrate and P type region 10 and 14 respectively are continuous to the processed main substrate surface 30 having a negative surface charge developed at the interface between the substrate 10 and the double layer film 32–34. Therefore the depletion layer involved can be spread as shown by dotted line 22 in FIG. 2B resulting in an increase in breakdown voltage of the resulting semiconductor element. On the other hand, the semiconductor element has disposed on the peripheral portion thereof the thermally formed silicon dioxide film 36 having a positive surface charge developed at the interface between the silicon dioxide and the silicon substrate. This ensures that the semiconductor element is prevented from decrease in breakdown voltage due to the particular channel region extending up to the end face of the substrate to excessively spread the depletion layer.

Since the main face 30 of the silicon substrate 10 is coated with the silicon nitride film 34 through the silicon dioxide film 32, during heating in the oxidative atmosphere upon forming the silicon oxide film 36, the negative surface charge at the interface between the film 32 and substrate 10 is retained. In order to ensure that the negative surface charge is retained at the processed main face 30 of the substrate 10 with the thermal oxidation or diffusion step effected for a long time interval, the oxidative atmosphere may be used for a short time interval and the remaining time interval is transferred to an inert atmosphere consisting, for example of nitrogen or argon.

According to one of conventional processes of producing semiconductor planar diodes, an electrically insulating film has been entirely removed from the associated semiconductor substrate after the completion of the diffusion operation whereby the main face thereof is exposed. Then the exposed main face has been immersed into aqueous hydrogen peroxide after which chemical vapor deposition technique is used to form on the processed main face a double layer film including either a silicon dioxide film and a silicon nitride film or a silicon dioxide film and a phosphosilicate glass film. This method can produce semiconductor element such as shown in FIG. 2B. However, when miniature diodes and transistors, integrated circuits etc. are produced according to the conventional process as above described, the photolithographic operation has been difficult to be performed. Therefore the diffusion after the main face of silicon substrates has been processed with aqueous hydrogen peroxide as above described in conjunction with FIGS. 2A and 2B is extremely advantageous in view of the standpoint of an increase in yield.

It has been found that semiconductor planar diodes produced in N type silicon substrates with the resistivity of from 30 to 30 ohm-centimeter by forming the P type diffusion region having a depth of about 20 micrometers have the reverse breakdown voltage of 800 volts or more. This figure indicates that the breakdown characteristic is very improved as compared with the breakdown voltage of at most about 500 volts exhibited by semiconductor planar diodes produced according to conventional processes with the resistivity of substrates and depth of diffusion remaining unchanged.

Figure 3:
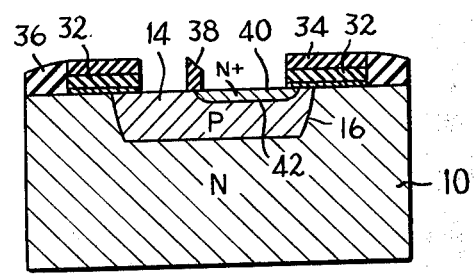
FIG. 3 is a schematic sectional view of a planar transistor constructed in accordance with the process of the present invention.

FIG. 3, wherein like reference numerals designate the components identical to those shown in FIG. 2B, illustrates an NPN type transistor constructed in accordance with the process of the present invention. In an arrangement similar to that shown in FIG. 2B, an silicon dioxide film 38 formed on the P type region 14 during the formation of the latter 14 is provided with a window. If desired, this silicon dioxide film 38 may be additionally disposed on the P type region 14. Then an N type impurity is selectively diffused into the P type region 14 to form an N+ type semiconductor region 40 with a PN junction 42 formed between both region 14 and 40 to partly terminate at that portion of the main substrate face overlaid by the silicon dioxide film 38. The remaining portion of the junction 42 termination faces that portion of the main face located below the remaining portion of the silicon nitride film 34.

Figure 4A:
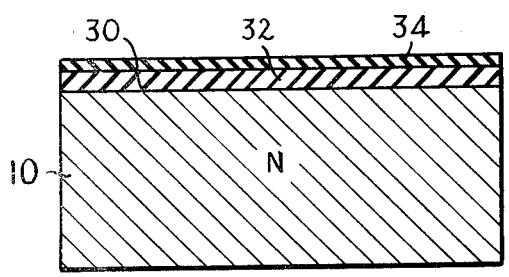
FIGS. 4A through 4E are schematic sectional views of a silicon substrate illustrated in the successive manufacturing steps of a process of producing a planar thyristor in accordance with the principles of the present invention.

FIGS. 4A through 4E wherein like reference numerals designate the components identical or similar to those shown in FIGS. 2A and 2B illustrate the process of the present invention applied to the production of a planar thyristor. FIG. 4A similar to FIG. 2A shows an N type silicon substrate 10 after having been processed as above described in conjunction with FIG. 2A.

Figure 4B:
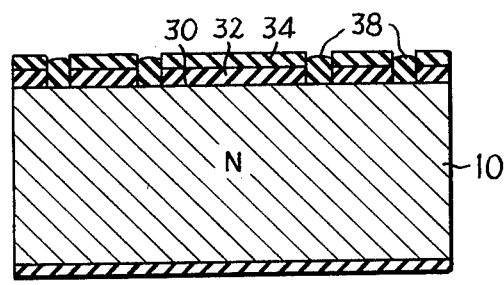

Then by selectively removing those portions of the double layer film including the silicon dioxide film 32 and the silicon nitride film 34 underlaid by terminations of two PN junctions to be subsequently formed and those portions of the main substrate face 30 adjacent thereto and then thermally oxidizing the substrate, silicon dioxide films 38 are formed on the exposed portions of the main substrate face 30 as shown in FIG. 4B.

Figure 4C:
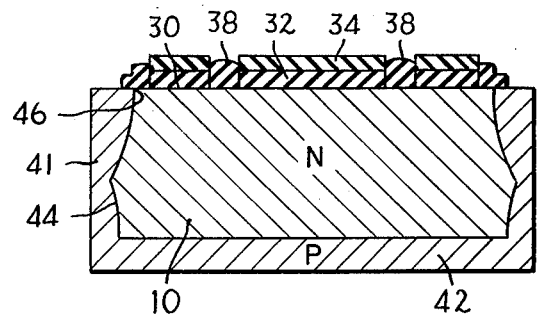

The next succeeding step is to form a P type diffusion region 41 for isolation as shown in FIG. 4C. To this end, the peripheral portion of the double layer film 32–34 is selectively removed to expose the peripheral portion of the main face 30 and then a P type impurity is diffused into the exposed peripheral portion of the main face 30 to form the P type diffusion region 41 for isolation in the N type silicon substrate 10. Following this, a silicon dioxide film (not shown) on the other main face of the substrate 10 is removed and a P type impurity is diffused into the other main face to form a P type emitter region 42 contiguous to the P type diffusion region 41. Thus a PN junction 44 serving as a reverse blocking junction is formed between the N type silicon substrate 10 and the contiguous P type regions 41 and 42 to terminate at 46 on that portion of the main face 30 positioned under the outer silicon dioxide film 38 as shown in FIG. 4C.

Figure 4D:
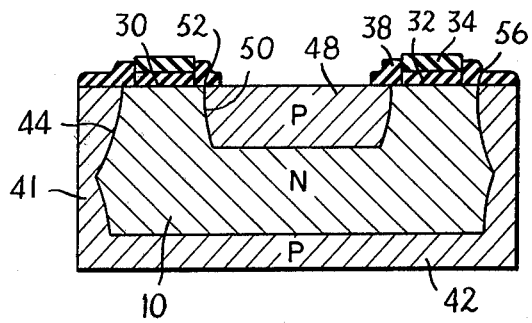

Then as shown in FIG. 4D, the central portion of the double layer film 32–34 enclosed with the inner silicon dioxide film 38 and underlaid by a P type base region to be subsequently formed is selectively removed and thereafter a P type impurity is selectively diffused into the now exposed portion of the main substrate face to form the P type base region designated by the reference numeral 48 in FIG. 4D and also a PN junction 50 serving as a forward blocking junction. This junction 50 has a termination 52 contacted by the inner silicon diode film 38.

In that event the selective diffusion may be accomplished in an oxidative atmosphere. Under these circumstances, the surface of the silicon substrate except for that portion thereof coated with the silicon nitride film 34 is oxidized resulting in the formation of a silicon dioxide film (not shown) having a positive surface charge developed at the interface between the silicon dioxide and the substrate. However the silicon dioxide film 32 overlaid by the silicon nitride film 34 has a negative surface charge developed at the interface between the film and the substrate because the nitride film 34 prevents oxygen from penetrating into the underlaid oxide film 32. If the selective diffusion is to be effected for a long time interval then an oxidative atmosphere is preferably used for a small portion of the time interval while a non-oxidative atmosphere such as nitrogen, argon or the like is used for the substantial portion thereof in order to prevent the silicon nitride film from fully oxidizing.

After the formation of the P type base region 48, that portion of a silicon dioxide film (not shown) formed on the region 48 in the selective diffusion step is provided with a window (see FIG. 4E) through which an N type impurity is diffused into the P type base region 48 to form an N+ type emitter region 54 and also a PN junction between both regions 48 and 54.

Figure 4E:
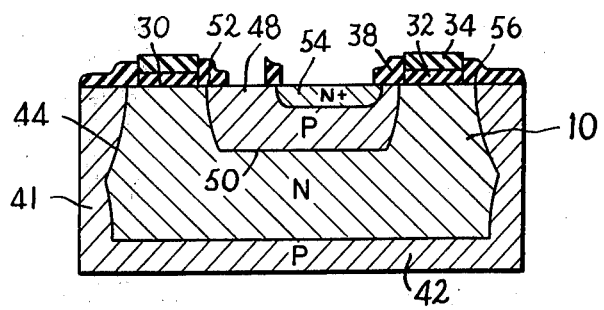

In this way a four layer structure has been formed including the N type emitter region or layer 54, the P type base region or layer 48, the N type region or layer 10 and the P type emitter region or layer 42 as shown in FIG. 4E.

The arrangement of FIG. 4E is possible to be formed as follows: After the completion of the selective diffusion effected in conventional processes of producing semiconductor planar diodes, the main face of the N type silicon substrate 10 or the surface of the N type base region can be exposed from one to the other of the vicinities of the terminals 46 and 52 of the junctions 44, 48 and 50 without contacting the terminations 46 and 52. Then the substrate thus exposed is immersed into aquaous hydrogen peroxide, after which chemical vapor deposition technique is used to form a double layer film consisting of a silicon dioxide film and a silicon nitride film or silicon dioxide film and phosphosilicate glass film. In this method, it becomes difficult to apply photolithographic technique to small-sized chips for thyristors, bi-directional triode thyristors such as triac's (trade mark) etc. Therefore the process of the present invention as above described is advantageous in view of the standpoint of the yield.

By applying the process of the present invention to an N type silicon substrate with a resistivity of from 30 to 40 ohms-centimeter to form a P type base region and a P type emitter region about 20 micro-meters in depth, the resulting thyristor element is possible to have its forward and reverse breakdown voltages of 800 volts or more. This figure indicates that the present invention can much increase the breakdown voltage as compared with conventional processes providing only the forward breakdown voltage of about 500 volts with the resistivity and the depths of diffusion remaining unchanged.

As shown in FIG. 4E, the terminations of the PN junctions and the adjacent portions of the main substrate face are coated with the silicon dioxide layers formed through the thermal oxidation and having a positive surface charge developed at the interface between the same and the substrate. Thus the spread of the associated depletion layer in the forward blocking state is limited by the positive surface charge in the vicinity of the reverse blocking junction 44 while the spread of the depletion layer in the reverse blocking state is limited by the positive surface charge in the vicinity of the forward blocking junction 50. This prevents the formation of a channel region.

Figure 5:
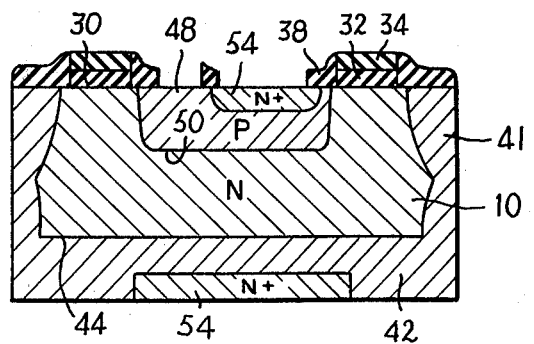
FIG. 5 is a schematic sectional view of a bi-directional triode thyristor of the planar type constructed in accordance with the process of the present invention.

In FIG. 5 wherein like reference numerals designate the components identical to those shown in FIG. 4E there is illustrated a bi-directional triode thyristor such as a triac (trade mark) constructed in accordance with the process of the present invention. After an arrangement such as shown in FIG. 4E has formed, a silicon dioxide film (not shown) on the other main face of the substrate 10 or the surface of the P type emitter region 42 is selectively removed and then an N type impurity is diffused into the P type region 42 through the exposed surface portion of the latter to form an N⁺ type emitter region 54. Thus the arrangement is of a five layer structure including the N⁺ type emitter layer 54, the P type base layer 48, the N type base layer 10, the P type emitter layer 42 and the N⁺ type emitter layer 54.

While the present invention has been illustrated and described in conjunction with a few preferred embodiments thereof it is to be understood that it is also equally applicable to other semiconductor planar devices having the forward and reverse blocking barriers.

What we claim is:

1. A process of producing a semiconductor planar device comprising the steps of immersing a main face of an N type silicon substrate into a selected one of aqueous hydrogen peroxide and a mixture of aqueous hydrogen peroxide and a chemical compound including an amino radical, successively depositing a silicon dioxide film and a silicon nitride film on the main face of the silicon substrate processed in the preceding step through the chemical vapor deposition, selectively removing those portions of said silicon dioxide film and said silicon nitride film underlaid by a predetermined area of said main face of said silicon substrate where a P type semiconductor region is formed thereby to expose said predetermined area of said main face of said silicon substrate, and diffusing a P type impurity into said predetermined exposed area of said main face to form a said P type semiconductor region with a PN junction formed therebetween to terminate at said main face of said silicon substrate.

2. A process of producing a semiconductor planar device as claimed in claim 1 wherein said PN junction terminates at that portion of said main face of said silicon substrate contacting the remaining portion of said silicon dioxide film.

3. A process of producing a semiconductor planar device as claimed in claim 1 further comprising the steps of selectively removing those portions of said silicon dioxide film and said silicon nitride underlaid by another predetermined area of said main face surrounding said predetermined area of said main face through a predetermined spacing to expose said another predetermined area of said main face of said silicon substrate, and forming a silicon dioxide film on said another predetermined exposed area of said main face through the thermal oxidation.

4. A process of producing a semiconductor planar device as claimed in claim 1 further comprising the steps of selectively removing only that portion of said silicon nitride film located above another predetermined area of said main face surrounding said predetermined area of said main face through a predetermined spacing to expose that portion of said silicon dioxide film located under the removed portion of said silicon nitride film, and forming an additional silicon dioxide film on the exposed portion of said silicon dioxide film through the thermal oxidation.

5. A process of producing a semiconductor planar device, comprising the steps of immersing a main face of an N type silicon substrate into a selected one of aquaous hydrogen peroxide and a mixture of aquaous hydrogen peroxide and a chemical compound including an amino radical, successively depositing a silicon dioxide film and a silicon nitride film on said main face of said silicon nitride processed in the preceding step through the chemical vapor deposition, selectively removing those portions of said silicon dioxide film and said silicon nitride film underlaid by both a first predetermined area of said main face where a P type region is formed and a second predetermined area of said main face surrounding said first predetermined area through a predetermined spacing to expose said first and second predetermined areas of said main face of said silicon substrate, forming a silicon dioxide film on said second predetermined exposed area of said main face, through the thermal oxidation, diffusing a P type impurity into said first predetermined area of said main face to form a P type semiconductor region in said N type silicon substrate so that a PN junction formed between said P type semiconductor region and said N type silicon substrate terminates at that portion of said main face of said silicon substrate located below the remaining portion of said silicon nitride film, and selectively diffusing an N type impurity into said P type semiconductor region to form an N type semiconductor region therein so that one portion of a PN junction formed between said P type semiconductor region and said N type semiconductor region terminates at that portion of said main face located below the remaining portion of said silicon nitride film.

6. A process of producing a semiconductor planar device comprising the steps of immersing a main face of an N type substrate into a selected one of aqueous hydrogen peroxide and a mixture of aqueous hydrogen peroxide and a chemical compound including an amino radical, successively depositing a silicon dioxide film and a silicon nitride film on said main face of said silicon substrate processed in the preceding step through the chemical vapor deposition, selectively removing only those portions of said silicon nitride film located above both a first predetermined area of said main face where a P type semiconductor region is formed and a second predetermined area of said main face surrounding said first predetermined area through a predetermined spacing to expose those portions of said silicon dioxide film, forming a silicon dioxide film on the exposed portion of said silicon dioxide film underlaid by said second predetermined area of said main face through the thermal oxidation, selectively removing the exposed portion of said silicon dioxide underlaid by said first predetermined area of said main face to expose the latter, diffusing a P type impurity into the first predetermined exposed area of said main face to form a P type semiconductor region in said N type substrate so that a PN junction formed between said P type semiconductor region and said N type substrate terminates at that portion of said main face located below the remaining portion of said silicon nitride film, and selectively diffusing an N type impurity into said P type region to form an N type semiconductor region so that one portion of a PN junction formed between said P type semiconductor region and said N type semiconductor region terminates at that portion of said main face of said silicon substrate located below the remaining portion of said silicon nitride film.

7. A process of producing a planar thyristor comprising an N type silicon substrate including an N type emitter layer, a P type base layer, an N type base layer and a P type emitter layer superposed on one another to form a four layer structure and PN junctions formed between the adjacent layers terminating at a main face of the silicon substrate, which process comprises the steps of immersing that main face of said silicon substrate providing the surface of the N type base layer into a selected one of aqueous hydrogen peroxide and a mixture of aqueous hydrogen peroxide and a chemical compound including an amino radical, successively depositing a silicon dioxide film and a silicon nitride film on said main face of said silicon substrate processed in the preceding step through the chemical vapor deposition, selectively removing those portions of said silicon nitride film located above the terminations of the PN junctions between the P type base layer and the N type base layer and between the N type base layer and the P type emitter layer and the adjacent portions of said main face to expose those portions of said silicon dioxide film overlaid by the removed portions of said silicon nitride film, and forming silicon dioxide films on the exposed portions of said silicon dioxide film, through the thermal oxidation.

8. A process of producing a planar bi-directional triode thyristor comprising an N type silicon substrate including a first N type semiconductor layer, a first P type semiconductor layer, a second N type semiconductor layer, a second P type semiconductor layer, and a third semiconductor layer superposed on one another to form a five layer structure and at least three PN junctions formed between at least three pairs of adjacent semiconductor layers to terminate at one main face of the silicon substrate, which process comprises the steps of immersing that of the N type silicon substrate providing the surface of the second N type semiconductor layer into a selected one of aqueous hydrogen peroxide and a mixture of aqueous hydrogen peroxide and a chemical compound including an amino radical, successively depositing a silicon dioxide film and a silicon nitride film on said main face of said silicon substrate processed in the preceding step through the chemical vapor deposition, selectively removing those portions of said silicon nitride film located above the terminations of the PN junctions between the first P type semiconductor layer and the second N type semiconductor layer and between the second N type semiconductor layer and the second P type semiconductor layer and the adjacent portions of said main face to expose those portions of said silicon dioxide film overlaid by the removed portions of said silicon nitride film, and forming silicon dioxide films on those portion overlaid by the removed portions of said silicon nitride film through the thermal oxidation.

* * * * *